United States Patent
Yau et al.

(10) Patent No.: US 9,262,021 B2
(45) Date of Patent: Feb. 16, 2016

(54) TWO LAYER CAPACITIVE SENSOR

(75) Inventors: Tai-Wei Yau, Taipei (TW); Yeh-Cheng Tan, Taipei (TW)

(73) Assignee: Synaptics Incorporated, San Jose, CA (US)

( * ) Notice: Subject to any disclaimer, the term of this patent is extended or adjusted under 35 U.S.C. 154(b) by 534 days.

(21) Appl. No.: 13/444,759

(22) Filed: Apr. 11, 2012

(65) Prior Publication Data

US 2013/0270095 A1    Oct. 17, 2013

(51) Int. Cl.
  *G01R 27/26* (2006.01)
  *G06F 3/044* (2006.01)
  *H03K 17/96* (2006.01)

(52) U.S. Cl.
  CPC ............ *G06F 3/044* (2013.01); *H03K 17/9622* (2013.01); *G06F 2203/04111* (2013.01); *H03K 2017/9602* (2013.01); *Y10T 29/49105* (2015.01)

(58) Field of Classification Search
  CPC ... G01R 27/2605; G01D 5/24; G06K 9/0002; G06F 3/044
  USPC .............. 324/658, 649, 661, 662; 340/870.37
  See application file for complete search history.

(56) References Cited

U.S. PATENT DOCUMENTS

| | | | |
|---|---|---|---|
| 7,208,961 B2 * | 4/2007 | Miyasaka | 324/686 |
| 7,821,274 B2 * | 10/2010 | Philipp et al. | 324/662 |
| 8,149,001 B2 * | 4/2012 | Iliev et al. | 324/686 |
| 8,482,301 B2 * | 7/2013 | Kurashima | 324/658 |
| 2008/0007534 A1 | 1/2008 | Peng et al. | |
| 2008/0042976 A1 | 2/2008 | Trent, Jr. et al. | |
| 2008/0088594 A1 | 4/2008 | Liu et al. | |
| 2008/0088595 A1 * | 4/2008 | Liu et al. | 345/173 |
| 2009/0160682 A1 | 6/2009 | Bolender et al. | |
| 2009/0242283 A1 * | 10/2009 | Chiu | 178/20.01 |
| 2010/0007616 A1 * | 1/2010 | Jang | 345/173 |
| 2010/0044122 A1 * | 2/2010 | Sleeman et al. | 178/18.06 |

(Continued)

FOREIGN PATENT DOCUMENTS

KR      1020110072573 A     6/2011

OTHER PUBLICATIONS

International Searching Authority, International Search Report and Written Opinion for PCT International Application No. PCT/US2013/035724, mailed Jul. 25, 2013.

(Continued)

*Primary Examiner* — Tung X Nguyen
*Assistant Examiner* — Dominic Hawkins
(74) *Attorney, Agent, or Firm* — Osha Liang LLP

(57) ABSTRACT

The embodiments described herein provide improved sensor devices and methods that facilitate improved sensor devices. Specifically, the devices and methods provide capacitive image sensors that require only two layers of conductive elements formed on a single substrate. The ability to provide an image sensor using only a single substrate with two layers of conductive elements may substantially reduce the cost and complexity of the capacitive image sensor. In one embodiment, an input device is provided that comprises a first substrate having a first and second side. Each of the second array of second sensor electrodes comprises a plurality of isolated components disposed on the first side and a plurality of connectors disposed on the second side. The connectors and isolated components of the second sensor electrodes are arranged such that adjacent pairs of connectors along the first direction are separated by a distance substantially greater than the first pitch.

19 Claims, 10 Drawing Sheets

(56) References Cited

U.S. PATENT DOCUMENTS

| | | |
|---|---|---|
| 2010/0073319 A1 | 3/2010 | Lyon et al. |
| 2010/0090712 A1* | 4/2010 | Vandermeijden ............. 324/658 |
| 2010/0149125 A1* | 6/2010 | Klinghult et al. ............. 345/174 |
| 2010/0265193 A1* | 10/2010 | Kung et al. ................... 345/173 |
| 2010/0300772 A1 | 12/2010 | Lee et al. |
| 2011/0032207 A1* | 2/2011 | Huang et al. .................. 345/174 |
| 2011/0227848 A1* | 9/2011 | Furusawa ..................... 345/173 |
| 2011/0234512 A1* | 9/2011 | Kim et al. ..................... 345/173 |
| 2011/0254108 A1* | 10/2011 | Gozzini et al. ................ 257/415 |
| 2012/0188195 A1* | 7/2012 | Fang ............................. 345/174 |
| 2012/0268142 A1* | 10/2012 | Kremin et al. ................ 324/658 |
| 2013/0049771 A1* | 2/2013 | Peng et al. .................... 324/658 |

OTHER PUBLICATIONS

The International Bureau of WIPO, International Preliminary Report on Patentability in International Application No. PCT/US2013/035724, mailed Oct. 23, 2014.

* cited by examiner

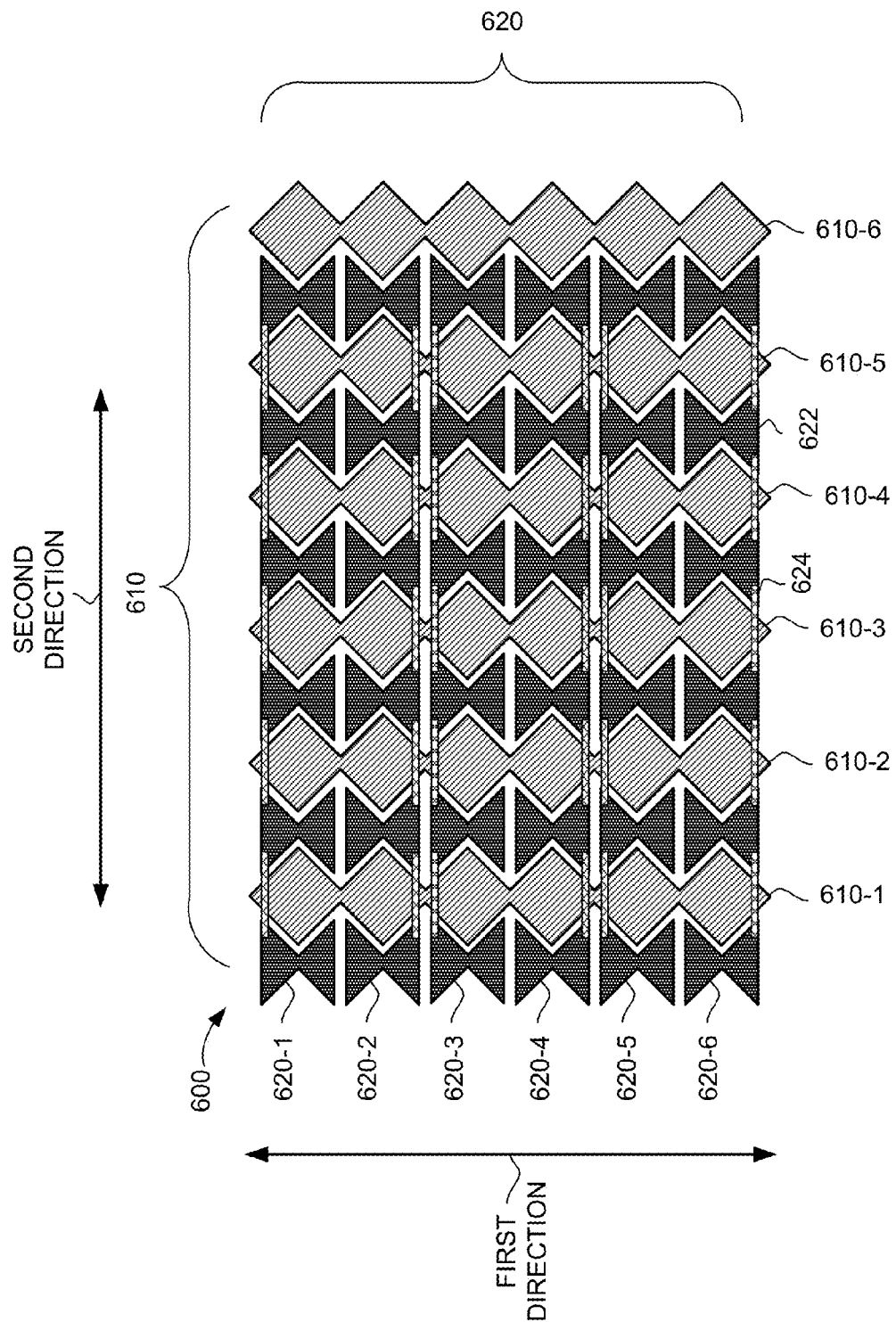

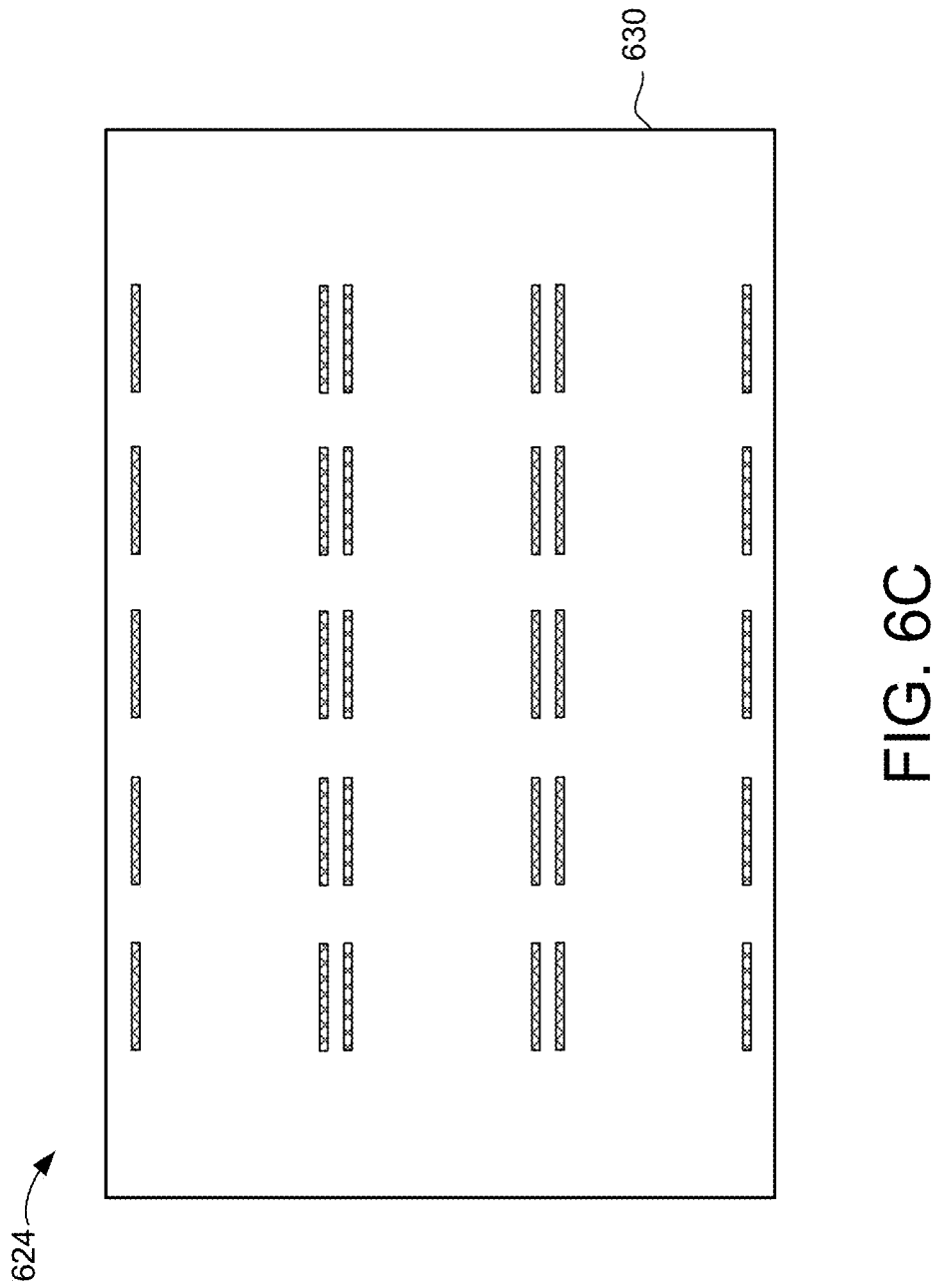

TWO LAYER CAPACITIVE SENSOR

FIELD OF THE INVENTION

This invention generally relates to electronic devices, and more specifically relates to sensor devices.

BACKGROUND OF THE INVENTION

Input devices including proximity sensor devices (also commonly called touchpads or touch sensor devices) are widely used in a variety of electronic systems. A proximity sensor device typically includes a sensing region, often demarked by a surface, in which the proximity sensor device determines the presence, location and/or motion of one or more input objects. Proximity sensor devices may be used to provide interfaces for the electronic system. For example, proximity sensor devices are often used as input devices for larger computing systems (such as opaque touchpads integrated in, or peripheral to, notebook or desktop computers).

Proximity sensor devices may typically incorporate either profile capacitive sensors or capacitive image sensors. Capacitive profile sensors alternate between multiple axes (e.g., x and y), while capacitive image sensors scan multiple transmitter rows to produce a more detailed capacitive "image" of "pixels" associated with an input object. While capacitive image sensors are advantageous in a number of respects, there is a continuing need to improve the performance of such devices. For example, there is a continuing need to reduce the cost and complexity of capacitive image sensors while maintaining good performance.

Other desirable features and characteristics will become apparent from the subsequent detailed description and the appended claims, taken in conjunction with the accompanying drawings and the foregoing technical field and background.

BRIEF SUMMARY OF THE INVENTION

The embodiments of the present invention provide devices and methods that facilitate improved sensor devices. Specifically, the devices and methods provide capacitive image sensors that require only two layers of conductive elements formed on a single substrate. The ability to provide an image sensor using only a single substrate with two layers of conductive elements may substantially reduce the cost and complexity of the capacitive image sensor.

In one embodiment, an input device is provided that comprises a first substrate having a first side and a second side. A first array of first sensor electrodes is disposed on the first side, with each of the first array of first sensor electrodes having a first major axis aligned in a first direction. A second array of second sensor electrodes is also provided, where each of the second array of second sensor electrodes has a second major axis aligned in a second direction and a first pitch in the first direction. Each of the second array of second sensor electrodes comprises a plurality of isolated components disposed on the first side and a plurality of connectors disposed on the second side. Each of the plurality of connectors ohmically couples two of the plurality of components along the second direction and through the first substrate to form the second array of second sensor electrodes. The connectors and isolated components of the second sensor electrodes are arranged such that adjacent pairs of connectors along the first direction are separated by a distance substantially greater than the first pitch. Such an arrangement facilitates the formation of the input device on the first side and second side of the substrate. For example, by providing a location for mounting an integrated circuit on the second side and between the adjacent pair of connectors. In such a configuration the input device may be formed of only conductive elements on the two sides of the first substrate, potentially reducing the cost and complexity of the input device.

In a second embodiment, capacitive input device is provided that comprises a first substrate having a first side and a second side. A first array of first sensor electrodes is disposed on the first side, each of the first array of first sensor electrodes having a first major axis aligned in a first direction. A second array of second sensor electrodes is provided, each of the second array of second sensor electrodes having a second major axis aligned in a second direction and a first pitch in the first direction. Each of the second array of second sensor electrodes comprises at least two isolated components disposed on the first side and at least one connector disposed on the second side. Specifically, each of the second array of second sensor electrodes is formed of at least two isolated components ohmically coupled together by the at least one connector. The isolated components and the connectors are arranged such that the distance along the first axis between two adjacent connectors of two adjacent sensor electrodes of the second array of sensor electrodes is at a distance of at least 1.5 the first pitch. Such an arrangement facilitates the formation of the input device on the first side and second side of the first substrate. For example, by providing a location for mounting an integrated circuit on the second side and between the adjacent pair of connectors. In such a configuration the input device may be formed of only conductive elements on the two sides of the first substrate, potentially reducing the cost and complexity of the input device.

In a third embodiment, a capacitive input device comprises a first printed circuit board (PCB) substrate having a first side and a second side. A first array of first sensor electrodes is disposed on the first side, where each of the first array of first sensor electrodes having a first major axis aligned in a first direction. A second array of second sensor electrodes is provided, each of the second array of second sensor electrodes having a second major axis aligned in a second direction and a first pitch in the first direction. A first sensor electrode in the second array of second sensor electrodes comprises at least four components disposed on the first side and at least two connectors disposed on the second side, where the at least four components are ohmically coupled together through the at least two connectors to define the first sensor electrode, and wherein the at least two connectors are disposed proximate distal ends of the at least four components. A second sensor electrode in the second array of second sensor electrodes, adjacent to the first sensor electrode, comprises at least four components disposed on the first side and at least two connectors disposed on the second side, where the at least four components are ohmically coupled together through the at least two connectors to define the second sensor electrode, and wherein the at least two connectors are disposed proximate distal ends of the at least four components such that each of the at least two connectors of the second sensor electrode are at distance of at least 1.5 times the first pitch from each of the at least two connectors in the first sensor electrode. An integrated circuit is mounted on the second side and between the at least two connectors for the first sensor electrode and the at least two connectors for the second sensor electrode, the integrated circuit communicably coupled to the first array of first sensor electrodes and the second array of second sensor electrodes. Again, in such a configuration the input device may be formed of only conductive elements on the two sides of the first PCB substrate, potentially reducing the cost and complexity of the input device.

A method for forming a capacitive input device is provided. The method comprises providing a first substrate having a first side and a second side, forming a first array of first sensor electrodes on the first side, each of the first array of first sensor electrodes having a first major axis aligned in a first direction, forming a plurality of isolated components, each of the isolated components part of a second array of second sensor electrodes where each of the second array of second sensor electrodes has a second major axis aligned in a second direction and a first pitch in the first direction, and forming a plurality of connectors disposed on the second side, each of the plurality of connectors ohmically coupling two of the plurality of components along the second direction and through the first substrate to form the second array of second sensor electrodes, wherein an adjacent pair of the plurality of connectors along the first direction are separated by a distance substantially greater than the first pitch. Such a method facilitates the formation of the input device on the first side and second side of the first substrate. For example, by providing a location for mounting an integrated circuit on the second side and between the adjacent pair of connectors. In such a configuration the input device may be formed of only conductive elements on the two sides of the first substrate, potentially reducing the cost and complexity of the input device.

BRIEF DESCRIPTION OF DRAWINGS

The preferred exemplary embodiment of the present invention will hereinafter be described in conjunction with the appended drawings, where like designations denote like elements, and.

DETAILED DESCRIPTION OF THE INVENTION

The following detailed description is merely exemplary in nature and is not intended to limit the invention or the application and uses of the invention. Furthermore, there is no intention to be bound by any expressed or implied theory presented in the preceding technical field, background, brief summary, or the following detailed description.

Figure 1:
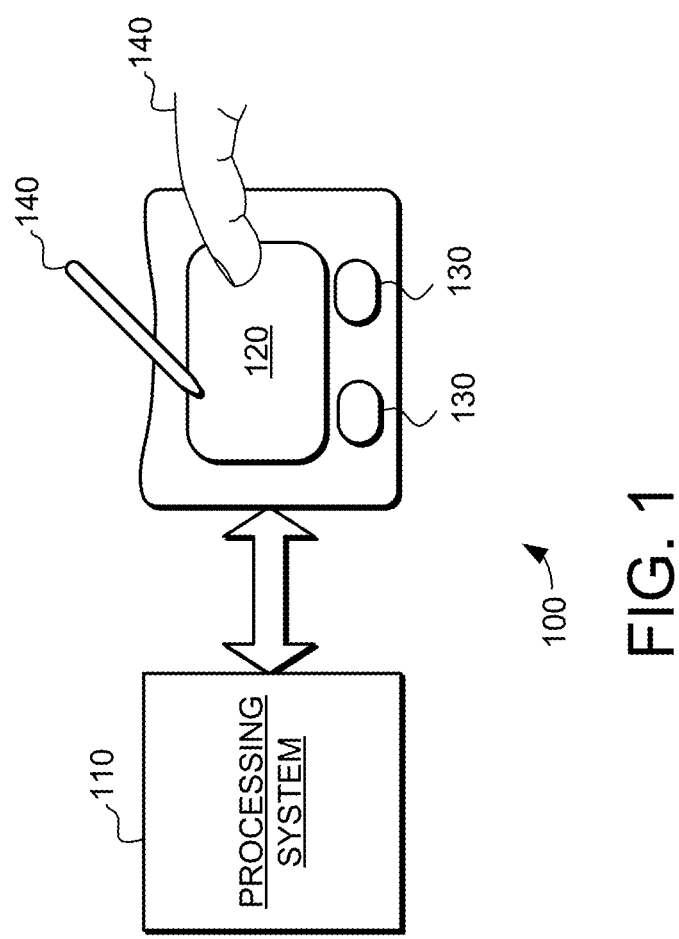
FIG. 1 is a block diagram of an exemplary system that includes an input device in accordance with an embodiment of the invention.

Various embodiments of the present invention provide input devices and methods that facilitate improved usability. FIG. 1 is a block diagram of an exemplary input device 100, in accordance with embodiments of the invention. The input device 100 may be configured to provide input to an electronic system (not shown). As used in this document, the term "electronic system" (or "electronic device") broadly refers to any system capable of electronically processing information. Some non-limiting examples of electronic systems include personal computers of all sizes and shapes, such as desktop computers, laptop computers, netbook computers, tablets, web browsers, e-book readers, and personal digital assistants (PDAs). Additional example electronic systems include composite input devices, such as physical keyboards that include input device 100 and separate joysticks or key switches. Further example electronic systems include peripherals such as data input devices (including remote controls and mice), and data output devices (including display screens and printers). Other examples include remote terminals, kiosks, and video game machines (e.g., video game consoles, portable gaming devices, and the like). Other examples include communication devices (including cellular phones, such as smart phones), and media devices (including recorders, editors, and players such as televisions, set-top boxes, music players, digital photo frames, and digital cameras). Additionally, the electronic system could be a host or a slave to the input device.

The input device 100 can be implemented as a physical part of the electronic system, or can be physically separate from the electronic system. As appropriate, the input device 100 may communicate with parts of the electronic system using any one or more of the following: buses, networks, and other wired or wireless interconnections. Examples include I$^2$C, SPI, PS/2, Universal Serial Bus (USB), Bluetooth, RF, and IRDA.

In FIG. 1, the input device 100 is shown as a proximity sensor device (also often referred to as a "touchpad" or a "touch sensor device") configured to sense input provided by one or more input objects 140 in a sensing region 120. Example input objects include fingers and styli, as shown in FIG. 1.

Sensing region 120 encompasses any space above, around, in and/or near the input device 100 in which the input device 100 is able to detect user input (e.g., user input provided by one or more input objects 140). The sizes, shapes, and locations of particular sensing regions may vary widely from embodiment to embodiment. In some embodiments, the sensing region 120 extends from a surface of the input device 100 in one or more directions into space until signal-to-noise ratios prevent sufficiently accurate object detection. The distance to which this sensing region 120 extends in a particular direction, in various embodiments, may be on the order of less than a millimeter, millimeters, centimeters, or more, and may vary significantly with the type of sensing technology used and the accuracy desired. Thus, some embodiments sense input that comprises no contact with any surfaces of the input device 100, contact with an input surface (e.g. a touch surface) of the input device 100, contact with an input surface of the input device 100 coupled with some amount of applied force or pressure, and/or a combination thereof. In various embodiments, input surfaces may be provided by surfaces of casings within which sensor electrodes reside, by face sheets applied over the sensor electrodes or any casings, etc. In some embodiments, the sensing region 120 has a rectangular shape when projected onto an input surface of the input device 100.

The input device 100 may utilize any combination of sensor components and to detect user input in the sensing region 120. The input device 100 comprises one or more sensing elements for detecting user input. In general, during operation of the input device 100, voltage or current is applied to create an electric field. Nearby input objects cause changes in the electric field, and produce detectable changes in capacitive coupling that may be detected as changes in voltage, current, or the like.

Some capacitive implementations utilize arrays or other regular or irregular patterns of capacitive sensing elements to create electric fields. In some capacitive implementations, separate sensing elements may be ohmically shorted together to form larger sensor electrodes.

Capacitive image sensors generally utilize "mutual capacitance" (or "transcapacitance") sensing methods based on changes in the capacitive coupling between sensor electrodes. In various embodiments, an input object near the sensor electrodes alters the electric field between the sensor electrodes, thus changing the measured capacitive coupling. In one implementation, a transcapacitive sensing method operates by detecting the capacitive coupling between one or more transmitter sensor electrodes (also "transmitter electrodes" or "transmitters") and one or more receiver sensor electrodes (also "receiver electrodes" or "receivers"). Transmitter sensor electrodes may be modulated relative to a reference voltage (e.g., system ground) to transmit transmitter signals. Receiver sensor electrodes may be held substantially constant relative to the reference voltage to facilitate receipt of resulting signals. A resulting signal may comprise effect(s) corresponding to one or more transmitter signals, and/or to one or more sources of environmental interference (e.g. other electromagnetic signals). Sensor electrodes may be dedicated transmitters or receivers, or may be configured to both transmit and receive.

In FIG. 1, processing system 110 is shown as part of the input device 100. The processing system 110 is configured to operate the hardware of the input device 100 to detect input in the sensing region 120. The processing system 110 comprises parts of or all of one or more integrated circuits (ICs) and/or other circuitry components. For example, as described in further detail below, a processing system for a mutual capacitance sensor device may comprise transmitter circuitry configured to transmit signals with transmitter sensor electrodes, and/or receiver circuitry configured to receive signals with receiver sensor electrodes).

In some embodiments, the processing system 110 also comprises electronically-readable instructions, such as firmware code, software code, and/or the like. In some embodiments, components composing the processing system 110 are located together, such as near sensing element(s) of the input device 100. In other embodiments, components of processing system 110 are physically separate with one or more components close to sensing element(s) of input device 100, and one or more components elsewhere. For example, the input device 100 may be a peripheral coupled to a desktop computer, and the processing system 110 may comprise software configured to run on a central processing unit of the desktop computer and one or more ICs (perhaps with associated firmware) separate from the central processing unit. As another example, the input device 100 may be physically integrated in a phone, and the processing system 110 may comprise circuits and firmware that are part of a main processor of the phone. In some embodiments, the processing system 110 is dedicated to implementing the input device 100. In other embodiments, the processing system 110 also performs other functions, such as operating display screens, driving haptic actuators, etc.

The processing system 110 may be implemented as a set of modules that handle different functions of the processing system 110. Each module may comprise circuitry that is a part of the processing system 110, firmware, software, or a combination thereof. In various embodiments, different combinations of modules may be used. Example modules include hardware operation modules for operating hardware such as sensor electrodes and display screens, data processing modules for processing data such as sensor signals and positional information, and reporting modules for reporting information. Further example modules include sensor operation modules configured to operate sensing element(s). In accordance with the embodiments described herein, the sensor module may be configured to transmit transmitter signals with transmitter electrodes and receive resulting signals with receiver electrodes. A further example includes determination modules, where the determination module is configured to process the resulting signals to produce outputs and determine positional information for an input object based on the outputs.

In some embodiments, the processing system 110 responds to user input (or lack of user input) in the sensing region 120 directly by causing one or more actions. Example actions include changing operation modes, as well as GUI actions such as cursor movement, selection, menu navigation, and other functions. In some embodiments, the processing system 110 provides information about the input (or lack of input) to some part of the electronic system (e.g. to a central processing system of the electronic system that is separate from the processing system 110, if such a separate central processing system exists). In some embodiments, some part of the electronic system processes information received from the processing system 110 to act on user input, such as to facilitate a full range of actions, including mode changing actions and GUI actions.

For example, in some embodiments, the processing system 110 operates the sensing element(s) of the input device 100 to produce electrical signals indicative of input (or lack of input) in the sensing region 120. The processing system 110 may perform any appropriate amount of processing on the electrical signals in producing the information provided to the electronic system. For example, the processing system 110 may digitize analog electrical signals obtained from the sensor electrodes. As another example, the processing system 110 may perform filtering or other signal conditioning. As yet another example, the processing system 110 may subtract or otherwise account for a baseline, such that the information reflects a difference between the electrical signals and the baseline. As yet further examples, the processing system 110 may determine positional information, recognize inputs as commands, recognize handwriting, and the like. In one embodiment, processing system 110 includes a determination module configured to determine positional information for an input device based on the measurement.

"Positional information" as used herein broadly encompasses absolute position, relative position, velocity, acceleration, and other types of spatial information. Exemplary "zero-dimensional" positional information includes near/far or contact/no contact information. Exemplary "one-dimensional" positional information includes positions along an axis. Exemplary "two-dimensional" positional information includes motions in a plane. Exemplary "three-dimensional" positional information includes instantaneous or average velocities in space. Further examples include other representations of spatial information. Historical data regarding one or more types of positional information may also be determined and/or stored, including, for example, historical data that tracks position, motion, or instantaneous velocity over time.

In some embodiments, the input device 100 is implemented with additional input components that are operated by the processing system 110 or by some other processing system. These additional input components may provide redundant functionality for input in the sensing region 120, or some other functionality. FIG. 1 shows buttons 130 near the sensing region 120 that can be used to facilitate selection of items using the input device 100. Other types of additional input components include sliders, balls, wheels, switches, and the like. Conversely, in some embodiments, the input device 100 may be implemented with no other input components.

In some embodiments, the input device 100 comprises a touch screen interface, and the sensing region 120 overlaps at least part of an active area of a display screen. For example, the input device 100 may comprise substantially transparent sensor electrodes overlaying the display screen and provide a touch screen interface for the associated electronic system. The display screen may be any type of dynamic display capable of displaying a visual interface to a user, and may include any type of light emitting diode (LED), organic LED (OLED), cathode ray tube (CRT), liquid crystal display (LCD), plasma, electroluminescence (EL), or other display technology. The input device 100 and the display screen may share physical elements. For example, some embodiments may utilize some of the same electrical components for displaying and sensing. As another example, the display screen may be operated in part or in total by the processing system 110.

It should be understood that while many embodiments of the invention are described in the context of a fully functioning apparatus, the mechanisms of the present invention are capable of being distributed as a program product (e.g., software) in a variety of forms. For example, the mechanisms of the present invention may be implemented and distributed as a software program on information bearing media that are readable by electronic processors (e.g., non-transitory computer-readable and/or recordable/writable information bearing media readable by the processing system 110). Additionally, the embodiments of the present invention apply equally regardless of the particular type of medium used to carry out the distribution. Examples of non-transitory, electronically readable media include various discs, memory sticks, memory cards, memory modules, and the like. Electronically readable media may be based on flash, optical, magnetic, holographic, or any other storage technology.

As described embodiment, the embodiments described herein facilitate the providing of the input device 100 in a way that requires only two layers of conductive elements formed on a single substrate. The ability to provide an image sensor using only a single substrate with two layers of conductive elements may substantially reduce the cost and complexity of the capacitive image sensor.

In one embodiment, an input device 100 is provided that comprises a first substrate having a first side and a second side. A first array of first sensor electrodes is disposed on the first side, with each of the first array of first sensor electrodes having a first major axis aligned in a first direction. A second array of second sensor electrodes is also provided, where each of the second array of second sensor electrodes has a second major axis aligned in a second direction and a first pitch in the first direction. Each of the second array of second sensor electrodes comprises a plurality of isolated components disposed on the first side and a plurality of connectors disposed on the second side. Each of the plurality of connectors ohmically couples two of the plurality of components along the second direction and through the first substrate to form the second array of second sensor electrodes. The connectors and isolated components of the second sensor electrodes are arranged such that adjacent pairs of connectors along the first direction are separated by a distance substantially greater than the first pitch. Such an arrangement facilitates the formation of the input device on the first side and second side of the substrate. For example, by providing a location for mounting an integrated circuit on the second side and between the adjacent pair of connectors. In such a configuration the input device 100 may be formed of only conductive elements on the two sides of the first substrate, potentially reducing the cost and complexity of the input device 100.

In a second embodiment, an input device 100 is provided that comprises a first substrate having a first side and a second side. A first array of first sensor electrodes is disposed on the first side, each of the first array of first sensor electrodes having a first major axis aligned in a first direction. A second array of second sensor electrodes is provided, each of the second array of second sensor electrodes having a second major axis aligned in a second direction and a first pitch in the first direction. Each of the second array of second sensor electrodes comprises at least two isolated components disposed on the first side and at least one connector disposed on the second side. Specifically, each of the second array of second sensor electrodes is formed of at least two isolated components ohmically coupled together by the at least one connector. The isolated components and the connectors are arranged such that the distance along the first axis between two adjacent connectors of two adjacent sensor electrodes of the second array of sensor electrodes is at a distance of at least 1.5 the first pitch. Such an arrangement facilitates the formation of the input device on the first side and second side of the first substrate. For example, by providing a location for mounting an integrated circuit on the second side and between the adjacent pair of connectors. In such a configuration the input device 100 may be formed of only conductive elements on the two sides of the first substrate, potentially reducing the cost and complexity of the input device.

In a third embodiment, an input device 100 comprises a first printed circuit board (PCB) substrate having a first side and a second side. A first array of first sensor electrodes is disposed on the first side, where each of the first array of first sensor electrodes having a first major axis aligned in a first direction. A second array of second sensor electrodes is provided, each of the second array of second sensor electrodes having a second major axis aligned in a second direction and a first pitch in the first direction. A first sensor electrode in the second array of second sensor electrodes comprises at least four components disposed on the first side and at least two connectors disposed on the second side, where the at least four components are ohmically coupled together through the at least two connectors to define the first sensor electrode, and wherein the at least two connectors are disposed proximate distal ends of the at least four components. A second sensor electrode in the second array of second sensor electrodes, adjacent to the first sensor electrode, comprises at least four components disposed on the first side and at least two connectors disposed on the second side, where the at least four components are ohmically coupled together through the at least two connectors to define the second sensor electrode, and wherein the at least two connectors are disposed proximate distal ends of the at least four components such that each of the at least two connectors of the second sensor electrode are at distance of at least 1.5 times the first pitch from each of the at least two connectors in the first sensor electrode. An integrated circuit is mounted on the second side and between the at least two connectors for the first sensor electrode and the at least two connectors for the second sensor electrode, the integrated circuit communicably coupled to the first array of first sensor electrodes and the second array of second sensor electrodes. Again, in such a configuration the input device 100 may be formed of only conductive elements on the two sides of the first PCB substrate, potentially reducing the cost and complexity of the input device.

Figure 2:
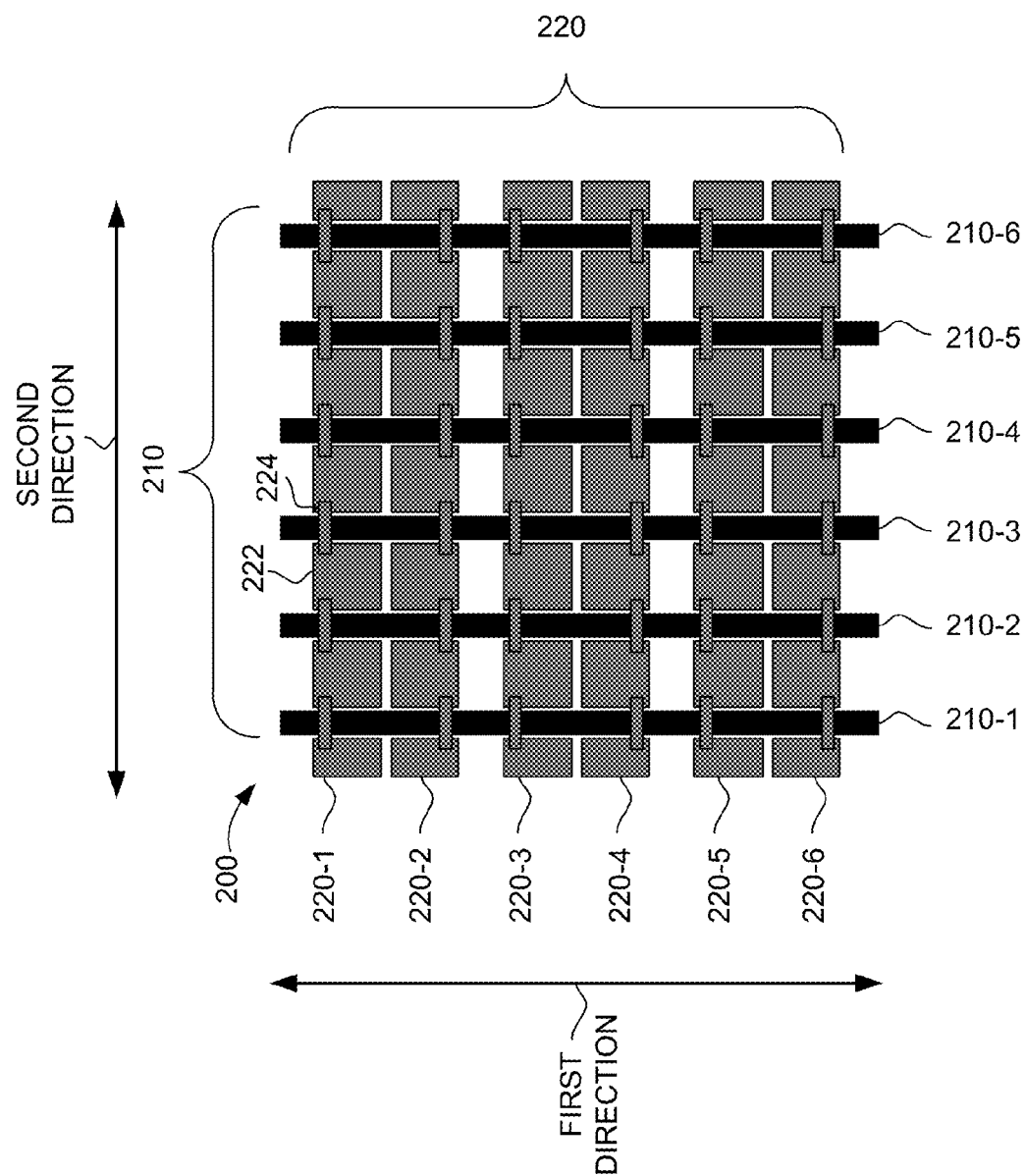
FIGS. 2 and 3 are top views of sensor electrodes in accordance with an exemplary embodiment of the invention.

As was described above, the processing system 110 is coupled to sensor electrodes to determine user input. Specifically, the processing system operates by detecting the capacitive coupling between one or more transmitter sensor electrodes and one or more receiver sensor electrodes. Turning now to FIG. 2, this figure conceptually illustrates an exemplary set of capacitive sensor electrodes 200 configured to sense in a sensing region. The sensor electrodes 200 comprise a first array of first sensor electrodes 210, and a second array of second sensor electrodes 220. For clarity of illustration and description, FIG. 2 shows a sensor electrodes that comprise simple rectangular elements; however, it will be appreciated that many typical embodiments will use more complex electrode shapes. In one embodiment, first sensor electrodes 210 are configured as receiver electrodes and second sensor electrodes 220 are configured as transmitter electrodes to facilitate transcapacitive sensing. In another embodiment, first sensor electrodes 210 are configured as transmitter electrodes and second sensor electrodes 220 are configured as receiver electrodes to facilitate transcapacitive sensing.

In a one embodiment, the sensor pattern is "scanned" to determine the capacitive couplings between transmitter and receiver electrodes. That is, the transmitter electrodes are driven to transmit transmitter signals and the receiver electrodes are used acquire the resulting signals. The resulting signals are then used to determine measurements of the capacitive couplings between electrodes, where each capacitive coupling between a transmitter electrode and a receiver electrode provides one "capacitive pixel". A set of measured values from the capacitive pixels form a "capacitive image" (also commonly referred to as a "capacitive frame") representative of the capacitive couplings at the pixels. Multiple capacitive images may be acquired over multiple time periods, and differences between them used to derive information about input in the sensing region. For example, successive capacitive images acquired over successive periods of time can be used to track the motion(s) of one or more input objects entering, exiting, and within the sensing region.

With reference to the embodiment illustrated in FIG. 2, transmitter signals may be transmitted with transmitter electrodes 220-1 through 220-6. Such transmission may occur sequentially or simultaneously. Resulting signals may then be received with each of the receiver electrodes 210-1 to 210-6. These resulting signals may then be used to determine capacitive measurements, where each of these determined capacitive measurements corresponds to a pixel in the capacitive image. Thus, capacitive measurements may be determined for each of the pixels corresponding to the capacitive couplings between transmitter electrodes 220-1 to 220-6 and each of the receiver electrodes 210-1 to 210-6.

In accordance with the embodiments described herein, the first sensor electrodes 210 each have a major axis aligned in a first direction, and are formed on a first side of a substrate (substrate not shown in FIG). Likewise, the second sensor electrodes 220 each have a major axis aligned in a second direction, where in this illustrated embodiment the first and second axis are substantially perpendicular. Finally, the second sensor electrodes 220 are arranged in a first pitch in the first direction. In this application, "pitch" is defined as the distance between corresponding points on adjacent members of a body of regular form. Thus, for this application the pitch is defined as the distance between corresponding points on adjacent sensor electrodes.

The second sensor electrodes 220 are each formed of a plurality of isolated components 222 and a plurality of connectors 224. Specifically, each of the plurality of connectors 224 ohmically couple two of the components 222, and thus together the isolated components 222 and connectors 224 form each of the second sensor electrodes 220. The plurality of isolated components 222 are formed on the first side of the substrate, while the plurality of connectors 224 are formed on a second side of the substrate.

When so formed, the first sensor electrodes 210 and the second sensor electrodes 220 are ohmically isolated from each other. That is, the isolated components 222 are formed on the first side of the substrate to be ohmically isolated from the first sensor electrodes 210. Likewise, the connectors 224, formed on the second side of the substrate, are formed to be ohmically isolated from the first sensor electrodes 210 while functioning to ohmically couple the isolated components 222 together. So formed, the capacitive coupling between the first sensor electrodes 210 and the second sensor electrodes 220 change with the proximity and motion of input objects in the sensing region associated with the electrodes.

Figure 3:
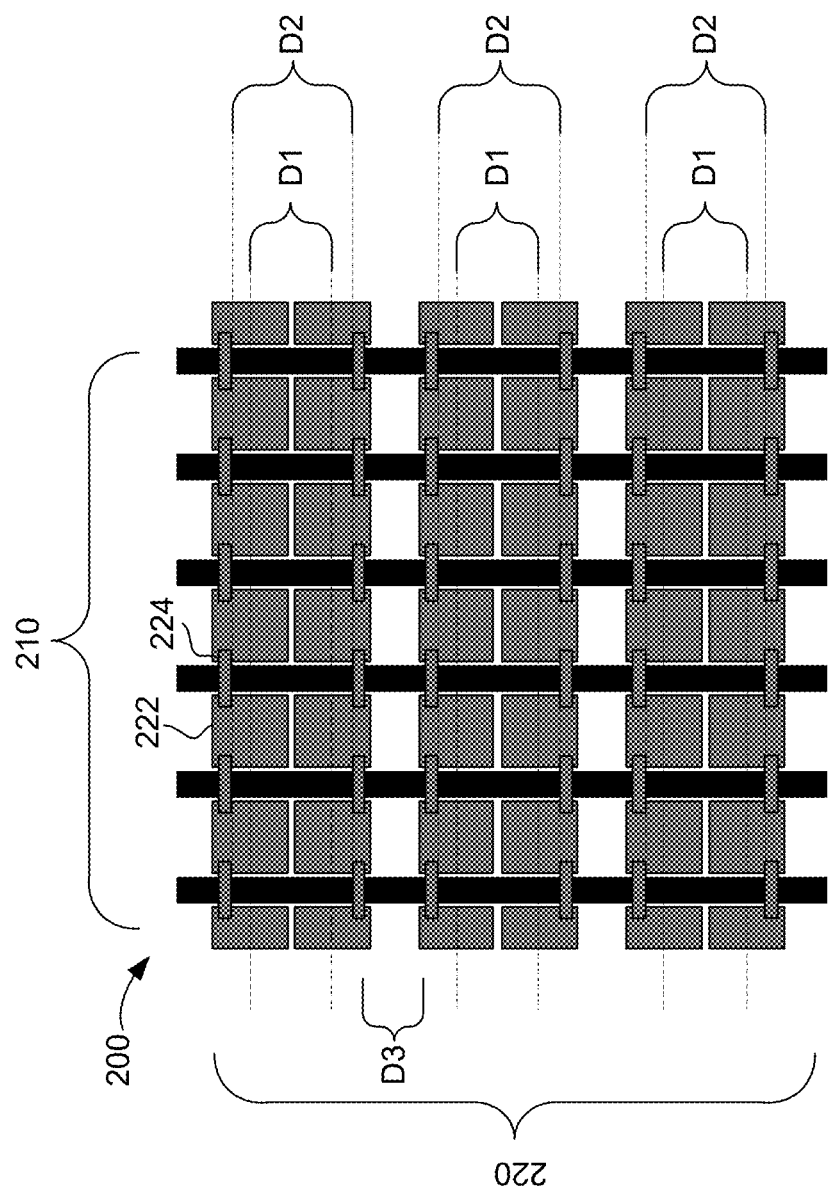

In accordance with the embodiments described herein, the isolated components 222 and the connectors 224 are arranged such that adjacent pairs of connectors along the first direction are separated by a distance substantially greater than the first pitch. In FIG. 2, this is accomplished by locating the connectors 224 relatively near the distal ends of their corresponding isolated components 222. Turning now to FIG. 3, the set of capacitive sensor electrodes 200 are illustrated showing the pitch distance D1 between adjacent second sensor electrodes 220, and the distance D2 between adjacent pairs of connectors 224. As is shown in FIG. 3, the distance D2 between adjacent pairs of connectors 224 is greater than the first pitch distance D1. This is accomplished in this case by locating the connectors 224 to couple near distal ends of the corresponding isolated components 222.

It should be noted this arrangement makes some adjacent pairs of connectors 224 closer. This is illustrated in FIG. 3 by the distance D3 between adjacent pairs of connectors 224. Thus, in such a configuration it is not required that the distance between all pairs of adjacent connectors 224 be substantially greater than the first pitch. Instead, it is sufficient that the connectors 224 be arranged such that the distance between some pairs of adjacent connectors 224 be substantially greater than the first pitch.

The spacing between adjacent pairs of connectors 224 can facilitate reduced complexity and cost. For example, by providing a location for mounting an integrated circuit on the second side and between the adjacent pair of connectors 224. Specifically, in such a configuration the input device may be formed of only conductive elements on the two sides of the first substrate, potentially reducing the cost and complexity of the input device.

Figure 4:
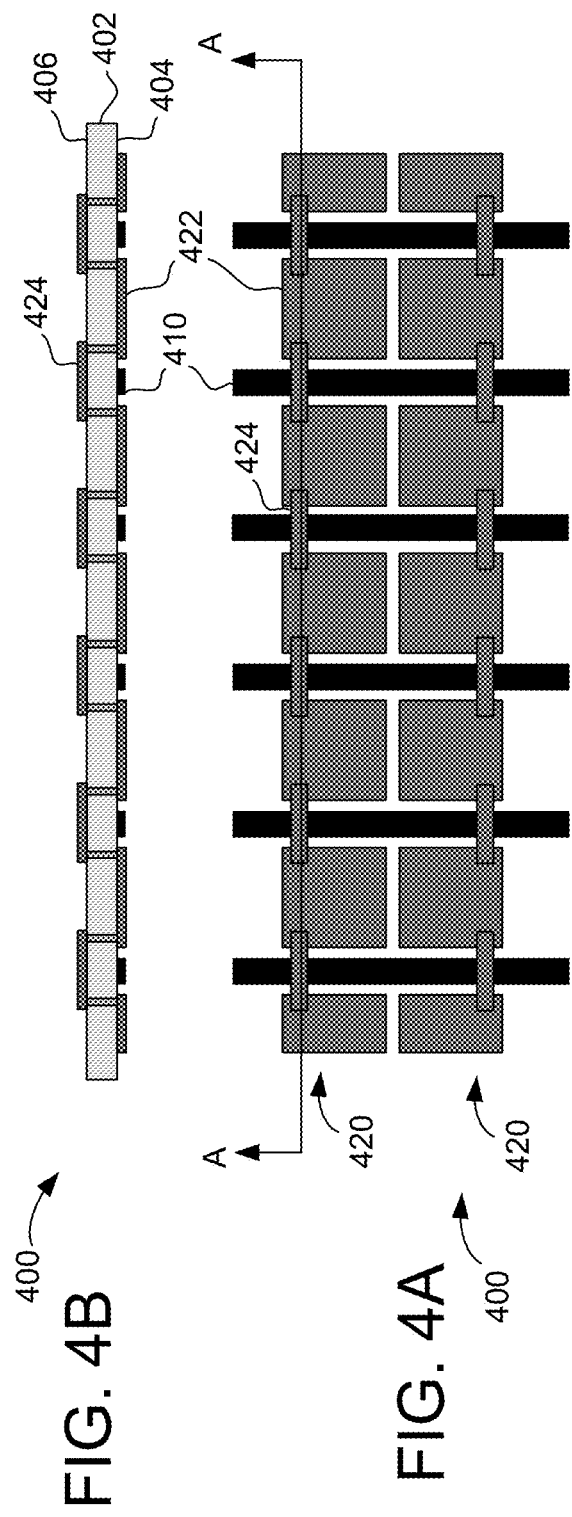
FIG. 4 is a top view and cross sectional side view of sensor electrodes in accordance with an embodiment of the invention.

Turning now to FIG. 4, a portion of sensor electrodes 400 is illustrated schematically in FIG. 4A, and a cross-sectional side view of sensor electrodes 400 taken along line A-A is illustrated in FIG. 4B. The cross-sectional side view in FIG. 4B shows the substrate 402 having a first side 404 and a second side 406. Like those embodiments illustrated in FIGS. 2 and 3, the first sensor electrodes 410 each have a major axis aligned in a first direction, and are formed on the first side 404 of the substrate 402. Likewise, the second sensor electrodes 420 each have a major axis aligned in a second direction and are arranged in to having spacing at a first pitch in the first direction.

The second sensor electrodes 420 are each formed of a plurality of isolated components 422 and a plurality of connectors 424. Specifically, each of the plurality of connectors 424 ohmically couple two of the components 422. Taken together the isolated components 422 and connectors 424 thus form each of the second sensor electrodes 420.

Specifically, the plurality of isolated components 422 are formed on the first side 404 of the substrate 402, while the plurality of connectors 424 are formed on a second side 406 of the substrate 402. The connectors 424 are coupled to the isolated components 422 though vertical interconnects 426.

Thus, the connectors 424, though vertical interconnects 426, ohmically couple pairs of isolated components 422 together. In the illustrated embodiment, each of the second sensor electrodes 420 is formed from seven isolated components 422 ohmically coupled together with connectors 424. So formed and defined the first sensor electrodes 410 and second sensor electrodes 420 may be used to determine a capacitive image indicative of the proximity and motion of input objects in the sensing region associated with the electrodes.

One aspect of the embodiments described herein is the ability to form a sensor device on only one substrate. This is facilitated by the ability to mount one or more integrated circuits on the second side of the substrate. Specifically, by arranging the connectors near the distal ends of the isolated components the spacing between some adjacent pairs of connectors is increased. In some embodiments this spacing is sufficient to facilitate mounting the integrated circuit(s) on the second side of the substrate and between the connectors. By mounting the integrated circuit(s) between the connectors the need for additional space on the substrate is reduced or eliminated. Furthermore, mounting the integrated circuit(s) between the connectors may reduce or eliminate the need for additional substrate and connecting devices, such as additional flex connectors and and/or flexible substrates that would otherwise be used to couple to the sensor device. Such an embodiment will be described in greater detail below.

Figure 5:
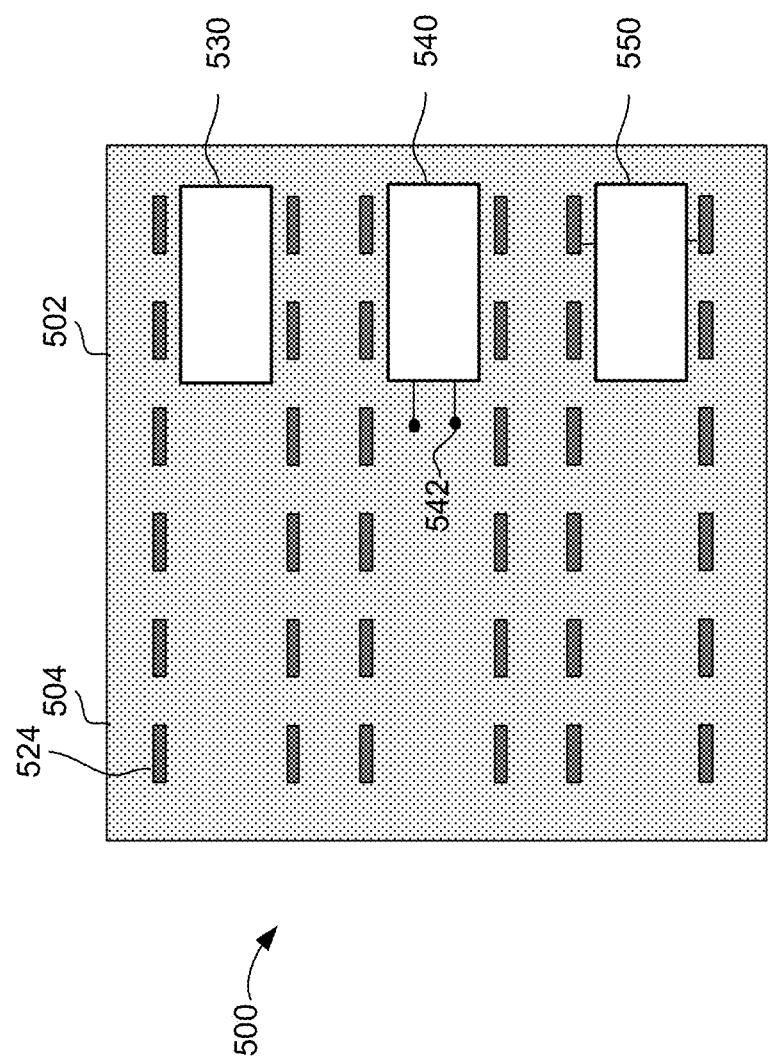
FIG. 5 is a schematic view of connectors on a second side of a substrate in accordance with an embodiment of the invention.

Turning now to FIG. 5, a portion of an input device 500 is illustrated schematically. The portion includes a substrate 502 having a first side (not shown) and a second side 504. First sensor electrodes (not shown) are formed on the first side. Likewise, the isolated components of second sensor electrodes (not shown) are also formed on the first side of the substrate 502. Each of the plurality of connectors 524 ohmically couple two of the isolated components (not shown). Taken together the isolated components and connectors 524 form each of the second sensor electrodes 420.

In accordance with the embodiments described herein, the connectors 524 are arranged such that adjacent pairs of connectors along the first direction are separated by a distance substantially greater than the first pitch. In FIG. 5, this provides spacing on the second side 504 of the substrate 502. In the illustrated embodiment, an integrated circuit 530 is mounted on the second side 504 of the substrate 502, between adjacent pairs of the connectors 524. The integrated circuit 530 may implement all or part of the processing system (e.g., processing system 110) used to determine user input.

In the illustrated embodiment, the configuration is such that adjacent pairs of connectors 524 have a distance between them of substantially greater than one pitch. In one specific embodiment this distance is further defined as at least 1.5 times the first pitch. In either of these cases the area of the second side 502 between adjacent connectors may be sufficient large to physically mount the integrated circuit. Such an embodiment may provide even more area on the second side for mounting of integrated circuits and the associated routing conductors that provide communicative coupling to and from integrated circuits.

This routing to the integrated circuit may include conductive elements though the substrate. For example, through vertical interconnects to sensor electrodes on the first side. In other embodiments, the integrated circuit may be communicatively coupled though the connectors used to connect isolated sensor components. In FIG. 5, the integrated circuit 540 is shown as being coupled to elements on the first side using vertical interconnects 542. These vertical interconnects 542 would typically be formed by making vias in the substrate 502 using any suitable technique and filing the vias with conductive material.

Finally, the integrated circuit 550 is shown as being coupled to other elements on the first side using nearby connectors 524. Such an arrangement has the additional advantage of reusing additional elements as needed.

In a further variation on these embodiments the increased spacing between electrodes provides the ability to mount components facilitating tactile feedback. In general "click touchpad" or "click pad" technology has been developed which allows touchpads, touch screens, and other touch sensors to provide tactile feedback by being at least partially depressable or "clickable." In such embodiments the "click" may be purely for tactile feedback or may be used to generate a signal that is used by the electronic system in which the click pad is installed. Examples of such click pad devices are found in U.S. patent application Ser. No. 12/729,969, entitled "Depressable Touch Sensor".

To facilitate such tactile feedback, the click pad can be implemented with a variety of structures used to facilitate movement of the touch surface. For example, sensor supports, guide mechanisms and other structures may be attached to the substrate to facilitate substantially uniform translation of the substrate towards a base in response to a force biasing the touch surface. Additionally, devices such as force sensors, haptic devices, and tactile sensors may be provided. Again, in devices where the connectors are arranged such that adjacent pairs of connectors along the first direction are separated by a distance substantially greater than the first pitch, the resulting space on the second side of the substrate may be used to mount these support and guide mechanisms, force sensors, haptic devices, and switches to the substrate. In all these cases, the resulting structure may be used to provide a cost effective device with "click-pad" functionality.

Figure 6B:
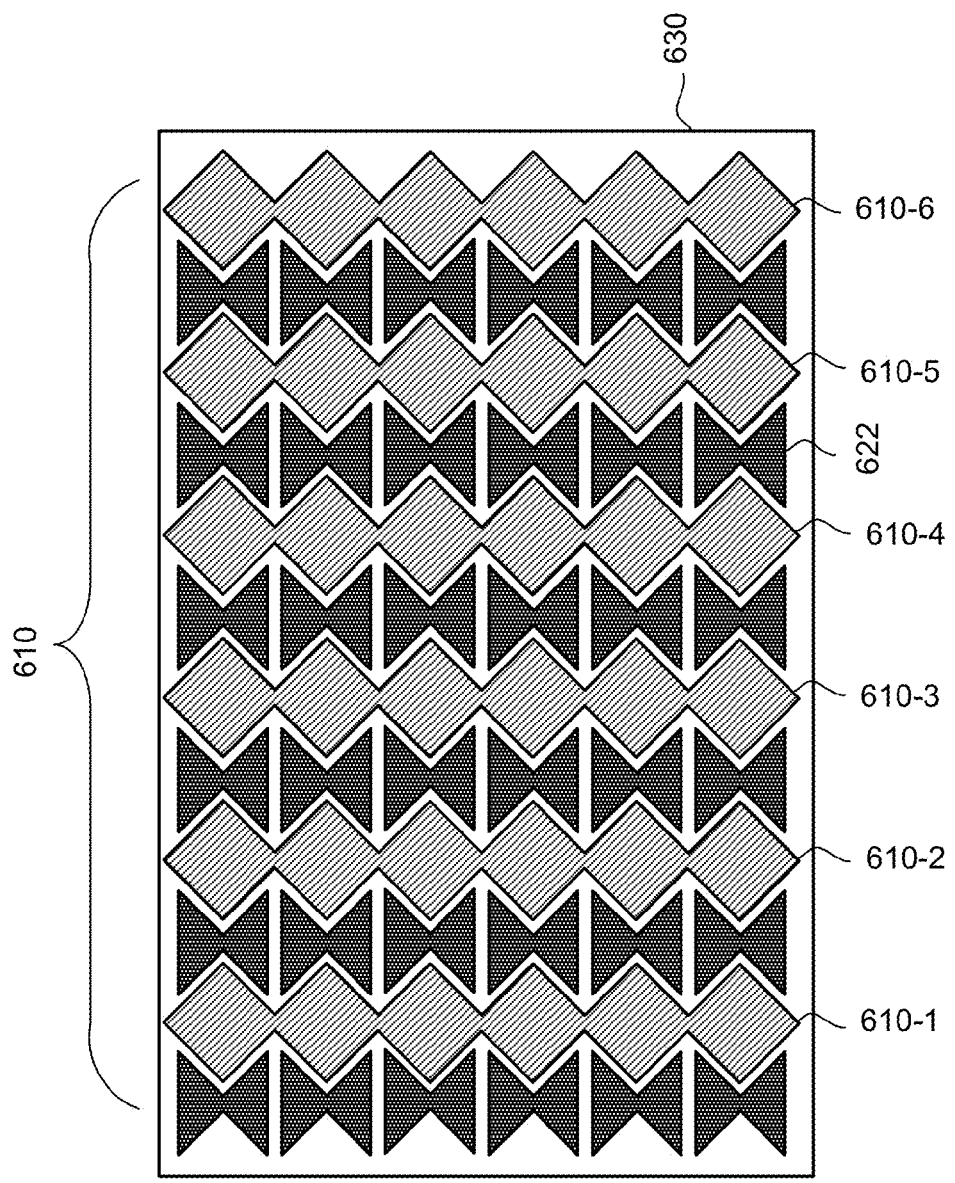
FIG. 6 are top views of sensor electrodes in accordance with an embodiment of the invention.

While the embodiments illustrated in FIGS. 2-5 have utilized primarily rectangular elements to make the sensor electrodes, this is just one example of the wide variety of shapes and configurations that may be used to provide the first and second sensor electrode arrays. Turning now to FIG. 6, this figure illustrates an exemplary set of capacitive sensor electrodes 600 configured to sense in a sensing region. Specifically, FIG. 6A conceptually illustrates the electrodes 600 by showing the elements that would be formed on the both sides of a substrate. FIG. 6B shows only the first sensor electrodes 610 and the isolated components 622 of the second electrode, both of which would be formed on the first side of the substrate 630. Finally, FIG. 6C shows only the connectors 624, which would be formed on the second side of the substrate 630 to ohmically couple the isolated components 622.

The sensor electrodes 600 comprise a first array of first sensor electrodes 610, and a second array of second sensor electrodes 620. In one embodiment, first sensor electrodes 610 are configured as receiver electrodes and second sensor electrodes 620 are configured as transmitter electrodes to facilitate capacitive sensing. In another embodiment, first sensor electrodes 610 are configured as transmitter electrodes and second sensor electrodes 620 are configured as receiver electrodes.

In accordance with the embodiments described herein, the first sensor electrodes 610 each have a major axis aligned in a first direction, and would be formed on a first side of a substrate 630 (substrate not shown in FIG. 6A). Likewise, the second sensor electrodes 620 each have a major axis aligned in a second direction, where in this illustrated embodiment the first and second axis are substantially perpendicular.

Finally, the second sensor electrodes 620 are arranged in a first pitch in the first direction.

The second sensor electrodes 620 are each formed of a plurality of isolated components 622 and a plurality of connectors 624. Specifically, each of the plurality of connectors 624 ohmically couple two of the components 622, and thus together the isolated components 622 and connectors 624 form each of the second sensor electrodes 620. The plurality of isolated components 622 are formed on the first side of the substrate 630 (as shown in FIG. 6B), while the plurality of connectors 624 are formed on a second side of the substrate 630 (as shown in FIG. 6C).

When so formed, the first sensor electrodes 610 and the second sensor electrodes 620 are ohmically isolated from each other. That is, the isolated components 622 are formed on the first side of the substrate to be ohmically isolated from the first sensor electrodes 610. Likewise, the connectors 624, formed on the second side of the substrate, are formed to be ohmically isolated from the first sensor electrodes 610 while functioning to ohmically couple the isolated components 622 together.

In accordance with the embodiments described herein, the isolated components 622 and the connectors 624 are arranged such that adjacent pairs of connectors along the first direction are separated by a distance substantially greater than the first pitch. In FIG. 6A-C, this is accomplished by locating the connectors 624 relatively near the distal ends of their corresponding isolated components 622. Such an arrangement facilitates the formation of the input device on the first side and second side of the first substrate. For example, by providing a location for mounting an integrated circuit or other elements on the second side and between the adjacent pair of connectors 624. In such a configuration the input device may be formed of only conductive elements on the two sides of the first substrate, potentially reducing the cost and complexity of the input device.

Figure 6D:
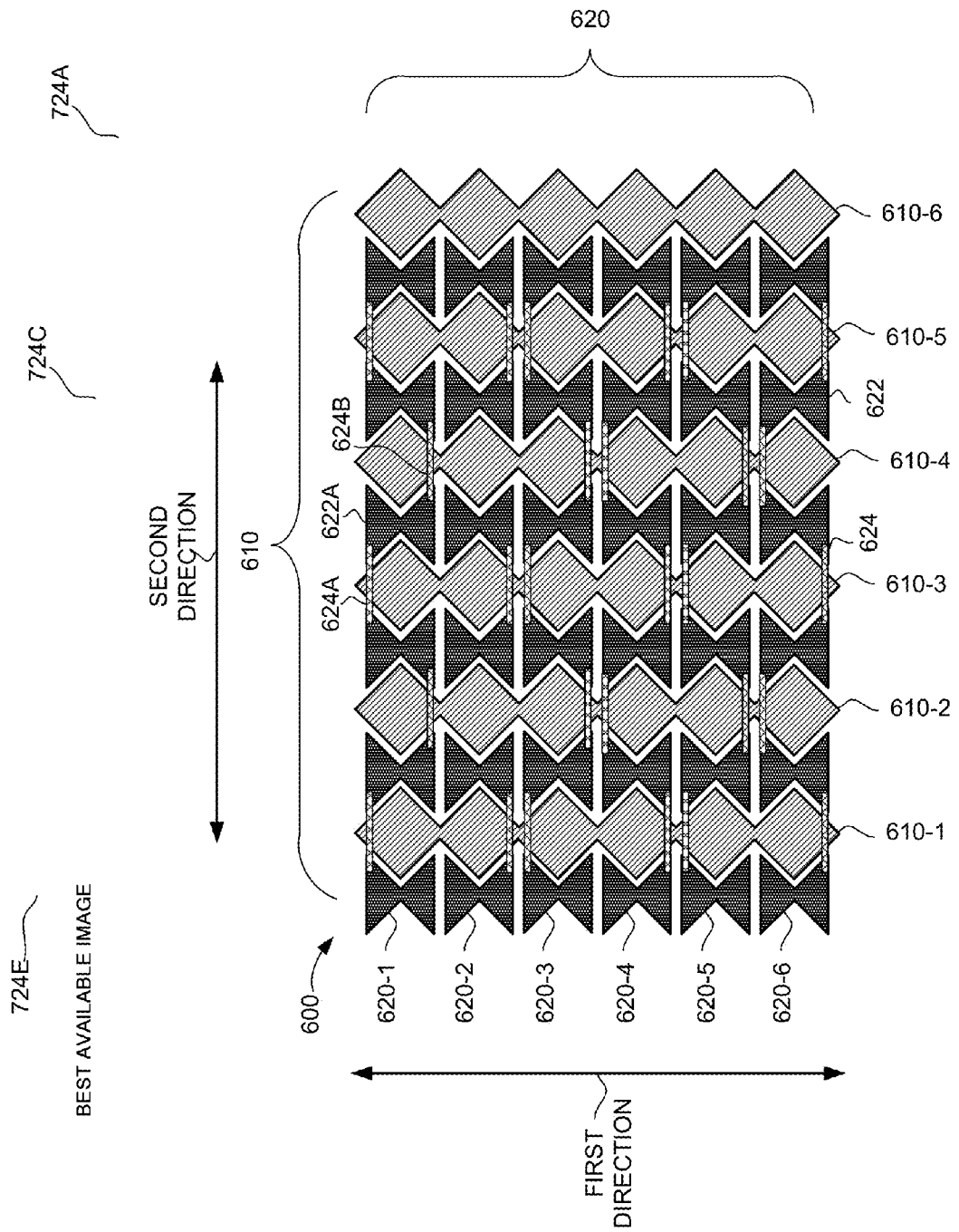

Turning now to FIG. 6D, this figure illustrates a variation on the embodiment illustrated in FIGS. 6A-6C. Again, FIG. 6D conceptually illustrates the electrodes 600 by showing the elements that would be formed on the both sides of a substrate. Again, the sensor electrodes 600 comprise a first array of first sensor electrodes 610, and a second array of second sensor electrodes 620.

In accordance with the embodiments described herein, the first sensor electrodes 610 each have a major axis aligned in a first direction, and would be formed on a first side of a substrate (substrate not shown in FIG. 6D). Likewise, the second sensor electrodes 620 each have a major axis aligned in a second direction, with the second sensor electrodes 620 arranged in a first pitch in the first direction. The second sensor electrodes 620 are each formed of a plurality of isolated components 622 and a plurality of connectors 624. Specifically, each of the plurality of connectors 624 ohmically couple two of the components 622, and thus together the isolated components 622 and connectors 624 form each of the second sensor electrodes 620. Again, the plurality of isolated components 622 are formed on the first side of the substrate, while the plurality of connectors 624 are formed on a second side of the substrate 630 (as shown in FIG. 6C).

In accordance with the embodiments described herein, the isolated components 622 and the connectors 624 are arranged such that adjacent pairs of connectors along the first direction are separated by a distance substantially greater than the first pitch. In FIG. 6D, this is accomplished by locating the connectors 624 relatively near the distal ends of their corresponding isolated components 622. It should be noted that in contrast with the previous embodiments, FIG. 6D shows an embodiment with the connectors are "staggered" from one distal end to the other along the second direction. Thus, connectors 624A and 624B are on opposite distal ends of isolated component 622A. Such staggering of isolated components 622 provides locations for the forming of other elements and the mounting of other devices, but in a staggered pattern. Thus, such an embodiment may provide increased design flexibility. Finally, it should be stated that embodiments that combine the arrangements of FIG. 6A-C and FIG. 6D may be provided. In these embodiments some connectors 624 may be staggered while others are not.

Figure 7:
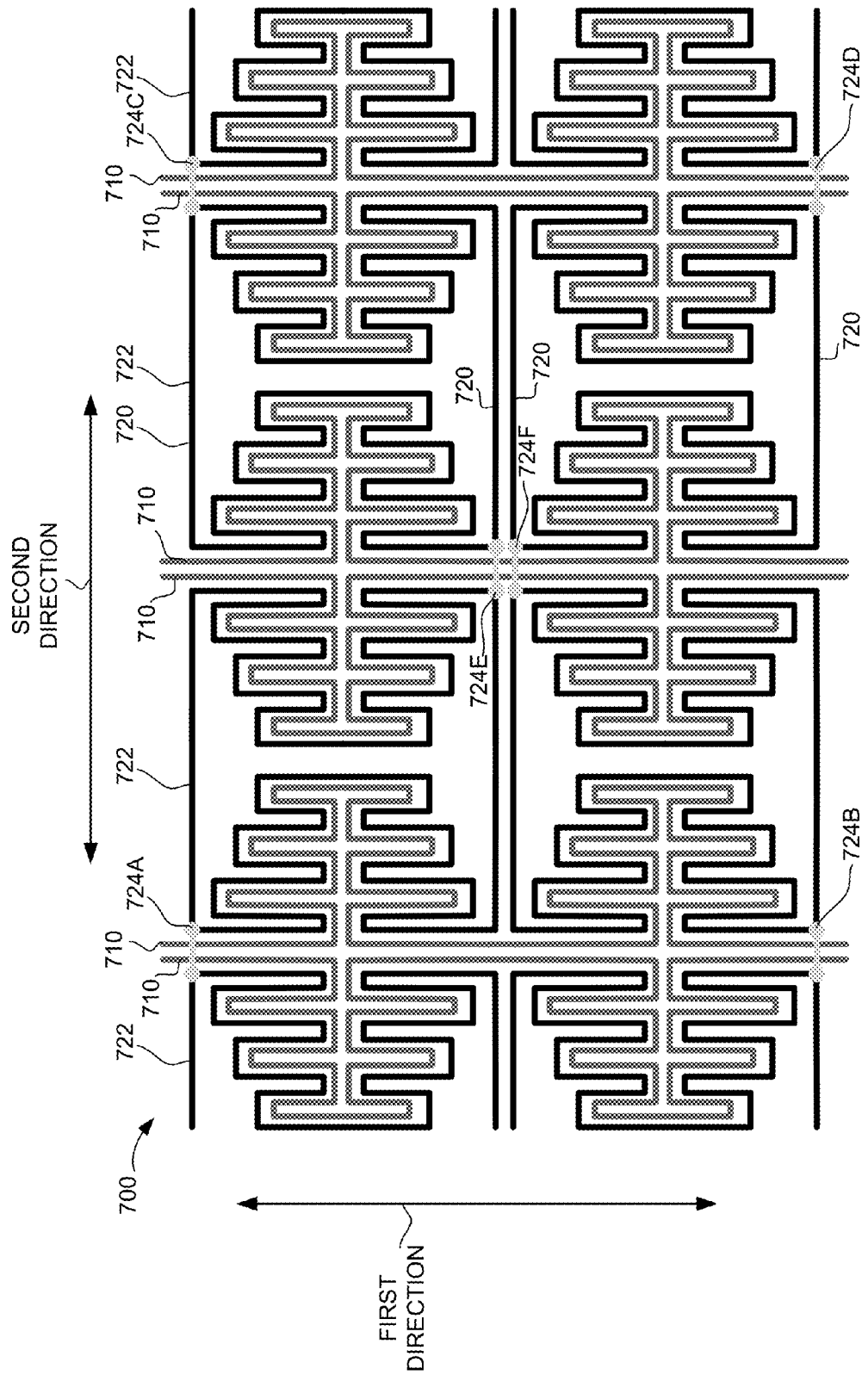
FIG. 7 is a top view of sensor electrodes in accordance with an embodiment of the invention.

Again, the above embodiments are just some examples of the wide variety of shapes and configurations that may be used to provide the first and second sensor electrode arrays. Turning now to FIG. 7, this figure illustrates an exemplary set of capacitive sensor electrodes 700 configured to sense in a sensing region. Specifically, FIG. 7 conceptually illustrates the electrodes 700 by showing the elements that would be formed on the both sides of a substrate. Specifically, FIG. 7 shows the first sensor electrodes 710 and the isolated components 722 of the second electrode, both of which would be formed on the first side of the substrate (substrate now shown in FIG. 7). Likewise, FIG. 7 shows the connectors 724, which would be formed on the second side of the substrate 730 to ohmically couple the isolated components 722.

In one embodiment, first sensor electrodes 710 are configured as receiver electrodes and second sensor electrodes 720 (which comprise isolated components 722 coupled together with connectors 725) are configured as transmitter electrodes to facilitate capacitive sensing. In another embodiment, first sensor electrodes 710 are configured as transmitter electrodes and second sensor electrodes (which comprise isolated components 722 coupled together with connectors 725) are configured as receiver electrodes.

In accordance with the embodiments described herein, the first sensor electrodes 710 each have a major axis aligned in a first direction. Likewise, the second sensor electrodes each have a major axis aligned in a second direction, where in this illustrated embodiment the first and second axis are substantially perpendicular. Finally, the second sensor electrodes 720 are arranged in a first pitch in the first direction.

The second sensor electrodes 720 are each formed of a plurality of isolated components 722 and a plurality of connectors 724. Specifically, each of the plurality of connectors 724 ohmically couple two of the components 722, and thus together the isolated components 722 and connectors 724 form each of the second sensor electrodes 720. The plurality of isolated components 722 are formed on the first side of the substrate, while the plurality of connectors 724 are formed on a second side of the substrate (substrate not shown in FIG. 7).

In accordance with the embodiments described herein, the isolated components 722 and the connectors 724 are arranged such that adjacent pairs of connectors along the first direction are separated by a distance substantially greater than the first pitch. For example, connectors 724A and 724B are an adjacent pair along the first direction that are separated by a distance substantially greater than the first pitch. Likewise, connectors 724C and 724D are an adjacent pair along the first direction that are separated by a distance substantially greater than the first pitch. Each connector 724E and 724F could also be separated from an adjacent connector along the first direction by a distance substantially greater than the first pitch, but in those cases the adjacent connectors are not shown in FIG. 7. It should be noted that like the embodiment of FIG. 6D, FIG. 7 shows an embodiment with the connectors are "staggered" from one distal end to the other along the second direction. Thus, connectors 724A and 724E are on opposite distal ends of isolated components 722.

Again, such an arrangement facilitates the formation of the input device on the first side and second side of the first substrate. For example, by providing a location for mounting an integrated circuit on the second side and between the adjacent pair of connectors 724. In such a configuration the input device may be formed of only conductive elements on the two sides of the first substrate, potentially reducing the cost and complexity of the input device.

Thus, the embodiments and examples set forth herein were presented in order to best explain the present invention and its particular application and to thereby enable those skilled in the art to make and use the invention. However, those skilled in the art will recognize that the foregoing description and examples have been presented for the purposes of illustration and example only. The description as set forth is not intended to be exhaustive or to limit the invention to the precise form disclosed.

What is claimed is:

1. A capacitive input device comprising:
a first substrate having a first side and a second side;
a first array of first sensor electrodes disposed on the first side, each of the first array of first sensor electrodes having a first major axis aligned in a first direction;
a second array of second sensor electrodes, each of the second array of second sensor electrodes having a second major axis aligned in a second direction, wherein the second array of sensor electrodes has a pitch in the first direction, wherein each of the second array of second sensor electrodes comprises:
a plurality of isolated components disposed on the first side; and
a plurality of connectors disposed on the second side, each of the plurality of connectors ohmically coupling two of the plurality of isolated components along the second direction and through the first substrate to form the second array of second sensor electrodes, and
wherein the pitch defines a first distance between centers of an adjacent pair of isolated components of different sensor electrodes in the second array of sensor electrodes, and
wherein an adjacent pair of connectors, based on being arranged on distal ends of the adjacent pair of isolated components, are separated by a second distance that is greater than the first distance, the second distance being along the first direction.

2. The capacitive input device of claim 1 wherein the second distance is at least 1.5 times the pitch.

3. The capacitive input device of claim 1 wherein each of the plurality of isolated components has a distal end located away from the second major axis of the second sensor electrode, and wherein each conductor is coupled to the distal end of two of the plurality of isolated components.

4. The capacitive input device of claim 1 further comprising an integrated circuit, the integrated circuit mounted on the second side and between the adjacent pair of connectors.

5. The capacitive input device of claim 4 wherein the integrated circuit is communicably coupled to the first array of first sensor electrodes and the second array of second sensor electrodes through the first substrate.

6. The capacitive input device of claim 4 wherein the integrated circuit is communicably coupled to the second array of second sensor electrodes through routing traces to the plurality of connectors.

7. The capacitive input device of claim 1 wherein the first substrate comprises a printed circuit board.

8. A capacitive input device comprising:
a first substrate having a first side and a second side;
a first array of first sensor electrodes disposed on the first side, each of the first array of first sensor electrodes having a first major axis aligned in a first direction;
a second array of second sensor electrodes, each of the second array of second sensor electrodes having a second major axis aligned in a second direction, wherein the second array of sensor electrodes has a pitch in the first direction, wherein each sensor electrode of the second array of second sensor electrodes comprises:
at least two isolated components disposed on the first side; and
at least one connector disposed on the second side, wherein the at least two isolated components are ohmically coupled together by the at least one connector to form the second sensor electrode,
wherein the pitch defines a first distance between centers of an adjacent pair of isolated components of different sensor electrodes in the second array of sensor electrodes, and
wherein an adjacent pair of connectors, based on being arranged on distal ends of the adjacent pair of isolated components, are separated by a second distance, and wherein the second distance is along the first direction and is at least 1.5 times the first distance.

9. The capacitive input device of claim 8 wherein each of the at least two isolated components has a distal end located away from the second major axis of a second sensor electrode, and wherein each conductor is coupled to the distal end of the at least two isolated components.

10. The capacitive input device of claim 8 further comprising an integrated circuit, the integrated circuit mounted on the second side and between the two adjacent connectors.

11. The capacitive input device of claim 10 wherein the integrated circuit is communicably coupled to the first array of first sensor electrodes and the second array of second sensor electrodes through the first substrate.

12. The capacitive input device of claim 10 wherein the integrated circuit is communicably coupled to the second array of second sensor electrodes through routing traces to the at least one connector.

13. The capacitive input device of claim 8 wherein the at least two isolated components are ohmically coupled to the at least one connector through vias in the first substrate.

14. A capacitive input device comprising:
a first printed circuit board (PCB) substrate having a first side and a second side;
a first array of first sensor electrodes disposed on the first side, each of the first array of first sensor electrodes having a first major axis aligned in a first direction;
a second array of second sensor electrodes, each of the second array of second sensor electrodes having a second major axis aligned in a second direction and a first pitch in the first direction; and wherein:
a first sensor electrode in the second array of second sensor electrodes comprises:
at least four components disposed on the first side and at least two connectors disposed on the second side, where the at least four components are ohmically coupled together through the at least two connectors to define the first sensor electrode, and wherein the at least two connectors are disposed at distal ends of the at least four components; and a second sensor electrode in the second array of second sensor electrodes, the second sensor electrode adjacent to the first sensor electrode, comprises:
  at least four components disposed on the first side and at least two connectors disposed on the second side, where the at least four components are ohmically coupled together through the at least two connectors to define the second sensor electrode, and wherein the at least two connectors are disposed on distal end regions of the at least four components such that each of the at least two connectors of the second sensor electrode are at a distance of at least 1.5 times the first pitch from each of the at least two connectors in the first sensor electrode,
  wherein the pitch defines a first distance between centers of the at least four components in the second sensor electrodes and the centers of the at least four components in the first sensor electrode; and
an integrated circuit, the integrated circuit mounted on the second side and between the at least two connectors for the first sensor electrode and the at least two connectors for the second sensor electrode, the integrated circuit communicably coupled to the first array of first sensor electrodes and the second array of second sensor electrodes.

15. A method for forming a capacitive input device, the method comprising:
  providing a first substrate having a first side and a second side;
  forming a first array of first sensor electrodes on the first side, each of the first array of first sensor electrodes having a first major axis aligned in a first direction;
  forming a plurality of isolated components on the first side, each of the isolated components part of a second array of second sensor electrodes where each of the second array of second sensor electrodes has a second major axis aligned in a second direction and a pitch in the first direction, wherein the pitch defines a first distance between centers of an adjacent pair of isolated components of different sensor electrodes in the second array of sensor electrodes, and
  forming a plurality of connectors disposed on the second side, each of the plurality of connectors ohmically coupling two of the plurality of isolated components along the second direction and through the first substrate to form the second array of second sensor electrodes, wherein an adjacent pair of the plurality of connectors, based on being arranged on distal ends of the adjacent pair of isolated components, are separated by a second distance that is greater than the first distance, the second distance being along the first direction.

16. The method of claim 15 wherein the second distance is at least 1.5 times the pitch.

17. The method of claim 15 further comprising mounting an integrated circuit on the second side and between the adjacent pair of the plurality of connectors.

18. The method of claim 17 further comprising forming a communication coupling between the integrated circuit and the first array of first sensor electrodes and the second array of second sensor electrodes through the first substrate.

19. The method of claim 17 further comprising forming a communication coupling between the integrated circuit and the second array of second sensor electrodes through routing traces to the plurality of connectors.

\* \* \* \* \*